United States Patent [19]

Umeda et al.

[11] Patent Number: 5,006,447
[45] Date of Patent: Apr. 9, 1991

[54] PHOTOSENSITIVE RESIN PLATE FOR FLEXOGRAPHY

[75] Inventors: Yasushi Umeda, Kusatsu; Hisao Satoh, Ibaragi, both of Japan

[73] Assignee: Nippon Paint Co., Ltd., Osaka, Japan

[21] Appl. No.: 337,403

[22] Filed: Apr. 13, 1989

[30] Foreign Application Priority Data

Apr. 13, 1988 [JP] Japan ................... 63-90739

[51] Int. Cl.$^5$ .................... G03F 7/028; G03F 7/11
[52] U.S. Cl. .................... 430/272; 430/271; 430/273; 101/395; 101/401.1
[58] Field of Search .................... 430/271, 272, 273; 101/395, 401.1

[56] References Cited

U.S. PATENT DOCUMENTS

| | | | |
|---|---|---|---|
| 3,990,897 | 11/1976 | Zuerger et al. | 430/271 X |
| 4,162,919 | 7/1979 | Richter et al. | 430/271 |
| 4,264,705 | 4/1981 | Allen | 430/271 |
| 4,332,873 | 6/1982 | Hughes et al. | 430/271 X |
| 4,415,649 | 11/1983 | Munger et al. | 430/271 |
| 4,547,453 | 10/1985 | Worns et al. | 430/271 |
| 4,582,777 | 4/1986 | Fischer et al. | 430/271 |

Primary Examiner—Cynthia Hamilton
Attorney, Agent, or Firm—Wenderoth, Lind & Ponack

[57] ABSTRACT

The present invention provides a photosensitive resin plate for flexographic printing, comprising;
(A) a substrate comprising a polyester film and a polyurethane or polyolefin foam layer on one side of said polyester film;
(B) an adhesive layer on the foam layer of said substrate;
(C) a polyurethane layer on said adhesive layer;
(D) a photosensitive layer which is provided on the polyurethane layer and is chemically bonded with the polyurethane layer, comprising a polymer having rubber elasticity, addition polymerizable unsaturated monomer and a polymerization initiator;
(E) a slip layer on the photosensitive layer which is dissolved with a developing solution; and
(F) a protective layer on the slip layer.

12 Claims, 1 Drawing Sheet

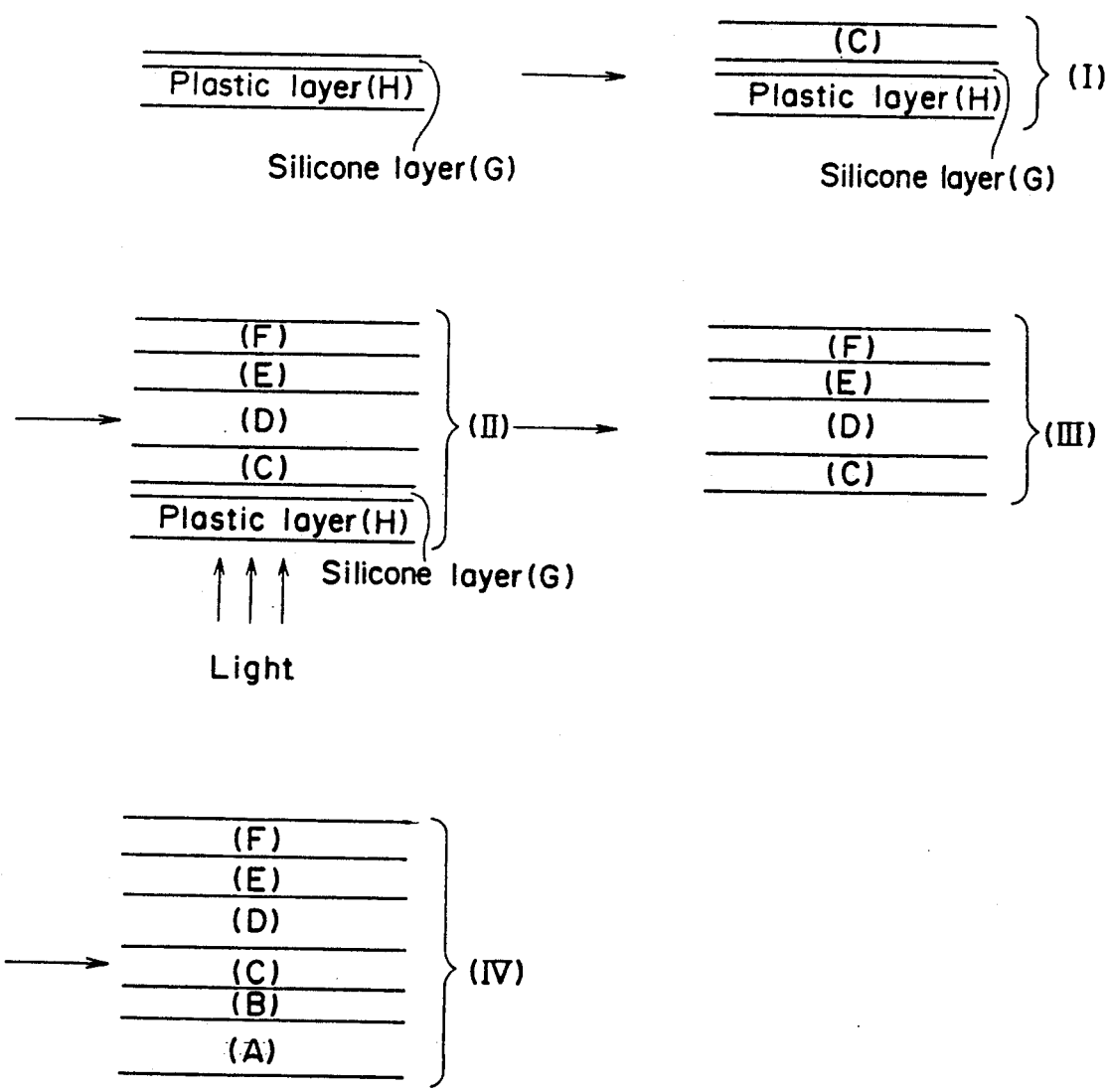
Figure

PHOTOSENSITIVE RESIN PLATE FOR FLEXOGRAPHY

FIELD OF THE INVENTION

The present invention relates to a photosensitive resin plate for flexographic printing. More particularly, it relates to a photosensitive resin plate for flexographic printing wherein a polyurethane anchor layer is inserted between a substrate and a photosensitive layer to improve adhesion properties.

BACKGROUND OF THE INVENTION

General applications of photosensitive resin plates include newspaper printing, flexographic printing, screen process printing and the like. Especially in flexographic printing which employs a plate having a thickness of more than 1 mm, a photosensitive resin plate is proposed wherein a continuous or closed cellular foam layer of polyurethane or polyolefin is placed on a polyester film in the presence or absence of an adhesive layer, and a photosensitive layer is then formed thereon through another adhesive layer. The foam layer is introduced in order to reduce the weight of the plate and improve printability.

However, in such a plate, polymerizable unsaturated monomers contained in the photosensitive layer or a plasticizer which is optionally added may transfer to the surface of the cellular foam layer and reduce the adhesion between the photosensitive layer and the adhesive layer on the foam layer. Accordingly, there are several problems, for example, adhesion between the adhesives on the cellular foam layer and the photosensitive layer is deteriorated during the period of storage, or they may be separated in the plate-making process or in the printing process. Thus, such problems are eagerly expected to be solved by the present invention.

SUMMARY OF THE INVENTION

According to the present invention, the above object may be attained by a photosensitive resin plate for flexographic printing, comprising;
(A) a substrate comprising a polyester film and a polyurethane or polyolefin foam layer on one side of the polyester film;
(B) an adhesive layer on the foam layer of the substrate;
(C) a polyurethane layer on the adhesive layer;
(D) a photosensitive layer which is provided on the polyurethane layer and is chemically bonded to the polyurethane layer, comprising a polymer having rubber elasticity, addition polymerizable unsaturated monomer and a polymerization initiator;
(E) a slip layer on the photosensitive layer which is dissolved with a developing solution; and
(F) a protective layer on the slip layer.

The present invention also provides a process for preparing the photosensitive resin plate.

BRIEF EXPLANATION OF THE DRAWING

FIG. 1 schmatically shows the process for preparing the photosensitive resin plate of the present invention.

DETAILED DESCRIPTION OF THE INVENTION

As a polymer binder component for a conventional photosensitive layer, any of the conventionally known ones, for example, crystalline 1,2-polybutadiene, styrene-butadiene-styrene copolymer, styrene-butadiene-styrene copolymer, nitrile butadiene resin, lower alcohol or water soluble polyamide resin, polyurethane resin, polyester, polyvinyl alcohol resin and the like may be used. Among them, a polymer having rubber elasticity, especially, styrene-isoprene-styrene block copolymer, styrene-butadiene-styrene block copolymer, polybutadiene, butadiene-acrylonitrile, urethane and modified polybutadiene are particularly preferred for the present invention.

The photosensitive layer of the present invention contains an addition polymerizable unsaturated monomer, for example, methyl acrylate, ethyl acrylate, n-propyl acrylate, octyl acrylate, lauryl acrylate, stearyl acrylate, 2-ethylhexyl acrylate, β-hydroxyethyl acrylate, β-hydroxypropyl acrylate, ethylene glycol acrylate, triethylene glycol diacrylate, polyethylene glycol monoacrylate, polypropylene glycol monoacrylate, polyethylene glycol diacrylate, polypropylene glycol diacrylate, methoxypolyethylene glycol monoacrylate, ethoxypoly ethylene glycol monoacrylate, glycerol diacrylate, pentaerythritol diacrylate, trimethylol ethane acrylate, trimethylol propane triacrylate, tetramethylol methane tetraacrylate, methyl methacrylate, ethyl methacrylate, n-propyl methacrylate, octyl methacrylate, lauryl methacrylate, stearyl methacrylate, 2-ethylhexyl methacrylate, β-hydroxyethyl methacrylate, β-hydroxypropyl methacrylate, ethylene glycol methacrylate, triethylene glycol dimethacrylate, triethylene glycol dimethacrylate, polyethylene glycol monomethacrylate, polypropylene glycol monomethacrylate, polyethylene glycol dimethacrylate, polypropylene glycol dimethacrylate, methoxypolyethylene glycol monomethacrylate, ethoxypolyethylene glycol monomethacrylate, glycerol dimethacrylate, pentaerythritol dimethacrylate, trimethylol ethane trimethacrylate, trimethylol propane trimethacrylate, tetramethylol methane tetramethacrylate, acrylamide, N-methylol acrylamide, m-butoxymethylacrylamide, isobutoxyacrylamide, n-t-butylacrylamide, methylenebis(acrylamide), ethylenebis(acrylamide), propylenebis(acrylamide), methacrylamide, N-methylolmethacrylamide, n-butoxymethylmethacrylamide, isobuthoxymethacrylamide, n-t-butyl methacrylamide, methylenebis(methacrylamide), ethylenebis(methacrylamide), propylene bis (methacrylamide) or a mixture thereof. The layer also contains a photopolymerization initiator aromatic ketone having an aromatic ring and a carbonyl group in the molecule, for example, benzoin, benzoin methyl ether, benzoin ethyl ether, benzoin isopropyl ether, α-methylbenzoin, 2-methylanthraquinone, 9-fluorenone, benzyl, benzyl methyl ketal, acetophenone, 2,2'-dimethoxy-2-phenyl acetophenone benzophenone, phenyl-2-thienyl ketone, p-dimethylaminobenzophenone, p,p'-tetramethyldiaminobenzophenone and the like; and those having a substituent such as cyano, nitro, methoxy, sulfonic acid, phosphinic acid or a salt thereof, ester thereof, for example, 2,6-dimethoxybenzoyl-diphenylphosphinoxide, 2,4,6-trimethylbenzoyl-diphenyl-phosphinoxide, 2,4,6-trimethylbenzoyl-phenylphosphinic acid ethyl ester, sodium 2,4,6-trimethylbenzoyl-phenylphosphinate) and the like. A thermal polymerization inhibitor (e.g., hydroquinone, p-methoxyphenol, t-butyl catechol, 2,6-di-t-butyl-p-cresol), dye, pigment, plasticizer and the like may be added to the photosensitive layer, if necessary.

The photosensitive layer and the foam layer of the substrate are generally bonded using an adhesive. In this case, it is a problem that the plasticizer and monomer and the like may transfer from the photosensitive layer to the surface of the foam layer to reduce adhesion of the interface, resulting in the separation of the photosensitive layer and the foam layer during storage, the plate-making process or the printing process.

Thus, in the present invention, a polyurethane layer is provided between the photosensitive layer and the foam layer. The polyurethane layer is bonded with the foam layer through an adhesive layer to maintain the integrity of the photosensitive layer and the substrate containing the foam layer. Further, the polyurethane layer prevents the monomer, plasticizer and the like in the photosensitive layer from transferring to the surface of the foam layer. Thus, the present invention has succeeded in completely solving the problem of separation caused during the storage of the plate, plate-making process and printing process. The photosensitive layer is chemically bonded with the polyurethane layer. This chemical bond may be preferably performed by fusion, adhesion or irradiation from the side of the polyurethane layer. Such polyurethane includes, for example, a two-pack polyurethane resin by addition reaction of polyisocyanates and polyalcohols, a moisture curing polyurethane resin which contains a prepolymer having free isocyanate groups which will be crosslinked by moisture in the air, and the like. Particularly, a two-pack polyurethane resin is preferred in practical application from the viewpoint of stability and workability. The polyalcohols employed in the two-pack polyurethane include aliphatic polyols, polyester polyols, polyether polyols, polylactone, and polycarbonate polyols. Examples of the aliphatic polyols are ethylene glycol, propylene glycol, neopentyl glycol, hexane diol, diethylene glycol, dipropylene glycol, spiroglycols and the like. Examples of the polyester polyols are a reaction product of a polybasic acid for example an aliphatic carboxylic acid (such as adipic acid, suberic acid, sebacic acid and brassylic acid), terephthalic acid, isophthalic acid and the like with the above mentioned aliphatic polyols. Examples of the polyether polyols are polyoxyethylene polyol, polyoxypropylene polyol, polyoxytetramethylene polyol and the like. The polyisocyanates are compounds having two or more, preferably two isocyanate groups in one molecule. Typical examples of the isocyanates are toluene diisocyanate, diphenylmethane diisocyanate, naphthalene diisocyanate, 3,3'-dimethyldiphenyl-4,4'-diisocyanate, 1,6-hexamethylene diisocyanate, xylylene diisocyanate, triphenylemthane triisocyanate, cyclohexylene diisocyanate and (thiono)-tris-[p-isocyanatophenyl]-ester. The polyisocyanate is employed in an amount of 0.3 to 8 equivalent based on one equivalent of the hydroxyl groups in the polyalcohols. Such two-pack polyurethane resin includes Hi-Bon 4251, 7663, 7033, 4154, 4120L, 4032, 7031L (made by Hitachi Polymer K.K.) and the like.

To bond the polyester layer and the foam layer of the substrate, commercially available pressure sensitive adhesives may be used. Examples of the adhesives are acrylic adhesives, epoxy adhesives, urethane adhesives, synthetic rubber adhesives and the like. Particularly, two-pack acrylic adhesives having high adhesive strength is preferable in practical application. For example, SK dyne 1717 (Soken Chemical Company) and the like. Pigments or dyes may be optionally added to the adhesive.

The substrate is composed of a polyester film and a polyurethane or polyolefin foam layer on one side of the polyester film. The polyester film and the foam layer may be adhered with an adhesive. The adhesive can be the same as mentioned above. The substrate is generally formed by placing polyurethane or polyolefin foam having cut in a suitable size on the polyester film. The substrate may also be prepared by coating a foamable composition on the polyester film and then heating to obtain a foam layer having a skin on a surface. The foam layer having a skin is required to have a uniform thickness.

The present inventors have further found that the object of the present invention is most preferably attained when the polyurethane layer is about 5–50μ in thickness.

On the photosensitive layer, similar to ordinary resin plate for flexographic printing, a so-called slip layer made from a polymer which is dissolved or swelled with a developing solution is formed on the photosensitive layer. Further, a sheet or film-like protective layer is formed thereon. A silicon release layer may be present between the protective layer and the slip layer.

As the polymer for such a slip layer, any resin, for example, polyamide resin, urea resin, urethane resin, melamine resin, acrylamide resin, polyvinyl acetate, vinyl copolymer, epoxy resin, cellulosic resin, butyral resin, acetal resin, acrylic resin and the like may be used. As a polymer which provides non-adhesive film with good lubricity, it is particularly useful to use methyl cellulose (e.g., Metrose made by Shin-Etsu Kagaku), ethyl cellulose (e.g., Ethocel made by The Dow Chemical Co.), polyvinyl alcohol (e.g., KH-20, KH-17 made by Nippon Gosei Kagaku), cellulose acetate butyrate (e.g., CAB381 made by Eastmann Kodak), carboxymethylcellulose (e.g., Sanlose made by Sanyo-Kokusaku Pulp), and polyvinyl butyral (e.g., BM-2 made by Sekisui Kagaku) and the like.

The main component of the protective layer includes a sheet of film-like plastics (e.g., polyester, polycarbonate, polyacrylate, polypropylene). Preferably, those treated by chemical or physical polishing (e.g., sand blasting) may be used. Particularly, the surface of the main component preferably has surface roughness less than 5μ (average).

The silicone release layer may be optionally provided between this protective material and the slip layer. Such silicone may be either an addition curing type or a condensation curing type. Typically, for example, Toray silicone paper, coating agent addition type SD7226 (catalyst SRX-212), condensation type SRX-244 (catalyst SRX-242AC) and the like may be preferably used.

In the photo-resin plate of the present invention, it is preferable to provide a dye, which is faded by activated radiation of ultraviolet region or visible region, preferably a dye which re-colors during development, in the photosensitive layer.

Typical examples of such dyes include, for example, C.I. acid red 249(color index 08134), C.I. direct red 20 (color index 15075), C.I. acid red 32 (color index 17065), C.I. acid red 92 (color index 45410), C.I. basic violet 7 (color index 48020), C.I. basic red 13 (color index 48015), C.I. solvent red 1 (color index 12150), C.I. solvent red 23 (color index 26100), C.I. solvent red 49 (color index 45170B), C.I. solvent red 109 (color index 13900) for magenta color. As cyan color, C.I. acid blue 83 (color index 42660), C.I. acid blue 9 (color index 42090), C.I. basic blue 1 (color index 42925), C.I. basic blue 5 (color index 42140), C.I. direct blue 106 (color index 51300), C.I. disperse blue 16 (color index 63395), C.I. solvent blue 2 (color index 42563B), C.I. solvent blue 36, C.I. solvent blue 93, C.I. solvent blue 73 and the like. Yellow color includes C.I. acid yellow 25 (color index 18835), C.I. acid yellow 29 (color index 18900), C.I. acid yellow 42 (color index 22910), C.I. disperse yellow 3 (color index 11855), C.I. reactive yellow 2 (color index 18972) and the like. As black color, C.I. acid black 52 (color index 15711), C.I. acid black 24 (color index 26370), C.I. direct black 17 (color index 27700) and the like. That is, dyes which can be dissolved in water, alcohol or an organic solvent can be used. Of course, these dyes may be used alone or in a combination thereof. Particularly, dyes having an anthraquinone structure, for example, C.I. 42563B and the like are preferably used for the purpose of the examination of plate and the like because dissolution during development and re-coloring of the exposed portion after drying are distinctly shown.

In the preferred embodiment of the present invention, when the above described photo-fading dye is present in the photosensitive layer, several advantages may be obtained, for example, the shoulder angle becomes sharp, reverse portion becomes deep, and the exposure latitude becomes wide upon the exposure. Dyes characterized by re-coloring during development are selected to visualize the image at development, which prevent fine point of line images from being unexpectedly removed by the blushing operation. Further, it is useful for cutting of extra printing material and other purpose such as examination of plate.

The photosensitive resin plate according to the present invention is produced by methods known in the art, for example, coating, bonding, fusing, adhering and the like. In the practice of the present invention, the photosensitive resin plate is prepared by a process shown in FIG. 1. A plastic layer (H) having a silicone layer (G) on one side is formed and the polyurethane layer (C) is then formed thereon. A three-layer structure consisting of the photosensitive layer (D), the slip layer (E) and the protective layer (F) is placed on it and exposed to light from the direction of the plastic layer (H). In this exposing process, the polyurethane layer (C) is chemically bonded to the photosensitive layer (D). Then, the plastic layer is released and the substrate (A) is adhered on one side of the polyurethane layer (C) through the adhesive layer (B).

When the plate is used, the sheet or film-like protective layer is separated before use and exposed through a negative. It is then developed to remove non-exposed portion and dried. The plate has characteristics of effectively preventing separation of the photosensitive layer and the foam layer during the plate making process and the printing process.

EXAMPLES

The present invention will be illustrated in the following examples.

EXAMPLE 1

[Preparation of the photosensitive layer (D)]

| | |
|---|---|
| Crystalline 1,2-polybutadiene | 70 parts |
| ("JSR RB810" made by Nippon Synthetic Rubber K.K.; | |
| degree of crystallization, 15%; 1,2-crystal structure, 88%; | |
| number-average molecular weight, about 110,000) | |
| Neopentyl glycol dimethacrylate | 10 |
| 2,2'-Dimethoxy-2-phenylacetophenone | 3 |
| Diisodecyl phthalate | 40 |
| Califlex TR1112 | 20 |
| P-Methoxyphenol | 0.05 |
| Sumiplast blue G | 0.001 |

(C.I. solvent blue 11 made by Sumitomo Kagaku; CI, 61525)

Among the above components, crystalline 1,2-polybutadiene and califlex TR1112 were charged in a pressurized kneader and mixed at the temperature of 90° C. for 30 minutes and a solution which was previously prepared by dissolving 2,2'-dimethoxy-2-phenylacetophenone, sumiplast blue G, p-methoxyphenol and diisodecyl phthalate in neopentyl glycol methacrylate was further added and mixed for 20 minutes. The mixture was uniformly fed between two sheets of PET film using a press machine to form a sheet of 1.7 mm thickness. Photosensitive layer (D).

[Preparation of the protective sheet (E,F)]

Separately, Toray silicone SRX-244 (SRX-242-AC as a catalyst) of solvent type was coated in the thickness of 0.5μ using a doctor blade on the polyester film (F) for protection the surface of which was roughened by chemical polishing method (average roughness: 3.0μ, thickness: 100μ). The resultant was left at room temperature for a day, and then a solution of medium type ethyl cellulose (made by The Dow Chemical Co., containing 45% ethoxy, 5 parts) and a toluene/isopropyl alcohol solution (95 parts) was further coated on the above coated surface using a bar coater and dried to give an ethyl cellulose film (E) of 2μ thickness.

[Preparation of the polyurethane layer (C, G, H)]

Toray silicone SR-244 and SRX-242-AC of solvent type were coated in the thickness of 0.4μ on a polyester film (H) of 100μ thickness using a doctor blade. After leaving at room temperature for a day, a mixture of two-liquid type urethane resin (Hi-Bon 4251) (100 parts) and isocyanate (dismodule R) (4 parts) was further coated on the above coated surface (G) and dried to give a film (C, G, H) having a cross-linked urethane resin film (C) of 20μ thickness.

[Preparation of the photosensitive structure layer (III)]

The above photosensitive sheet (D) of 1.7 mm thickness was heated in a drier at 60° C. for 5 minutes, and immediately after the sheet was taken out from the drier, a polyethylene telephalate (PET) film on one side was peeled off and the ethocel-coated surface of the above ethocel-coated polyester film (E, F) for protection was fused onto the surface of the photosensitive layer using a rubber roller. Further, a PET film on the other side was peeled off and the urethane film surface of the above polyurethane layer (C, G, H) was fused onto the surface of the photosensitive layer using g rubber roller. Thus, the photosensitive structure (II) having ethocel layer on one side and polyurethane layer on the other side (C) was obtained. Subsequently, the photosensitive structure (II) was exposed from the side having the polyurethane layer (C) using a chemical lump (3 mW/cm) at 5 cm's distance for 30 seconds.

Then, silicone-treated PET (G, H) which supports the polyurethane layer was peeled off and the photosensitive structure layer (III) having a chemically adhered polyurethane layer (C) was obtained.

[Preparation of the Photosensitive sheet]

Two liquid type acrylate adhesives (SK dyne 1717) (100 parts) and isocyanate (1.5 parts) were mixed and coated on the closed-cell urethane foam (A) having a skin on a surface (thickness: 1.25 mm, density: 0.32, elongation: 115%, impact resilience: 38%, compression residual strain: 4.6% (according to JIS-K-6301)) bonded on the polyester film and dried to give an adhesive layer (B) of 30–40$\mu$. The photosensitive structure layer (III) was bonded onto the adhesive layer (B) using a rubber roller to form (IV), from which the polyester sheet for protection (F) is removed to obtain the photosensitive sheet having a photosensitive layer surface coated with noncohesive ethyl cellulose film (surface roughness: max. 3.0$\mu$, thickness: 2$\mu$). When a negative having solid images was layered on the above photosensitive surface, it was easily placed in a correct position under vacuum. The sheet was exposed to a ultraviolet lump for 10 minutes and the negative was then removed after stopping vacuum operation. The negative could be easily removed from the surface of the photosensitive layer without damaging the negative. The exposed portion was discolored to transparent and unexposed portion was blue. Thus, the pattern in the negative could be clearly identified by visual observation. Subsequently, the photosensitive sheet was developed with a mixture of 75 wt % of 1,1,1-trichloroethane and 25 wt % of isopropyl alcohol for 2 minutes, dried in a drying oven at 50° C. for 20 minutes to give a plate having a relief of 0.8 mm wherein the exposed portion was colored to blue which faithfully reproduced the negative and having good shoulder (floor: 0.9 mm). The solid portion of the plate was cut into 2.5 cm×20 cm, and peel strength (180° C.) of the interface of the photosensitive layer containing an polyurethane layer and the adhesive layer on the foam layer was determined using Tensilone (UTM-V) at peel rate of 200 mm/min. at 20° C. As the result, the sample had adhesion strength of 1,900 g/inch.

Further, the plate having relief was mounted onto a stack press having lattice-type anilox with 360 lines and printed on polypropylene film (thickness: 100$\mu$) using Sakata 360 H XA-55 ink (viscosity, 20 sec.: shell Cup-3) at printing rate of 400 m/min. for 7 hours. No abnormality of separation at the interface of the polyurethane layer and the adhesive layer of the plate was observed.

EXAMPLE 2

[Preparation of the photosensitive layer]

In the same manner as that in Example 1, the photosensitive layer (D) of 1.7 mm thick was obtained.

[Preparation of the protective layer (E' F')]

On the polyester film for protection of 100$\mu$ thickness which was not subjected to the chemical polishing treatment, solvent type Toray silicone SRX-244 (SRX-242AC as a catalyst) was coated in the thickness of 0.4$\mu$ using a doctor blade. After one day at room temperature, a solution of polyvinyl butyral resin (tripolymer of vinyl butyral/vinyl acetate/vinyl alcohol; butyralization degree, 65±2 mol %; number-average polymerization degree, 1,000–2,000) (5 parts) in toluene/isopropyl alcohol solution (95 parts) was further coated on the coated surface using a bar coater and dried to give polyvinyl butyral resin film of 3$\mu$ thickness.

[Preparation of the polyurethane layer (C', G, H)]

In the same manner as that in Example 1, except that two-liquid type urethane resin and isocyanate were substituted with saturated polyester resin (Hi-Bon 7663, made by Hitachi Kasei) (100 parts) and isocyanate (Takenate D-103) (4 parts), cross-linked polyurethane film having thickness of 30$\mu$ was obtained.

[Preparation of the photosensitive structure layer (III')]

In the same manner as that in Example 1, except that the protective sheet and the polyurethane layer were substituted with the above polyvinyl butyral resin film and the polyurethane film, the photosensitive structure layer (III') having chemically-adhered polyurethane layer (C') was obtained.

[Preparation of the photosensitive sheet]

In the same manner as that in Example 1, (photosensitive sheet (V') was obtained.

The photosensitive sheet (V') had a photosensitive layer surface coated with noncohesive polyvinyl butyral film having smooth surface (thickness: 3$\mu$). When the negative having solid images was layered on the above photosensitive surface, it was easily placed in a correct position under vacuum. The sheet was exposed to a ultraviolet lump for 10 minutes and the negative was then removed after stopping vacuum operation. The negative could be easily removed from the surface of the photosensitive layer without damaging the negative. Subsequently, the photosensitive sheet was developed with 1,1,1-trichloroethane for 90 seconds, and dried in a drying oven at 50° C. for 30 minutes to give a plate having relief of 0.8 mm (floor: 0.9 mm).

According to the examination in the same manner as that in Example 1, adhesive strength of the interface of the photosensitive layer containing the polyurethane layer and the adhesive layer on the foam layer was 2,000 g/inch.

After printing at the printing speed of 400 m/min. for 8 hours in the same manner as that in Example 1, no abnormality of separation at the interface of the polyurethane layer and the adhesive layer of the plate was observed.

EXAMPLE 3

[Preparation of the sensitized layer]

In the same manner as that in Example 1, sensitized layer (D) of 1.7 mm thickness was obtained.

[Preparation of the photosensitive structure layer (III')]

In the same manner as that in Example 1, photosensitive structure layer (III'') was obtained.

[Preparation of the photosensitive sheet (V'')]

In the same manner as that in Example 1, except that urethane foam was substituted with a closed cell ethylene/vinyl acetate foam having a skin on a surface (thickness: 1.10 mm; compression hardness: 0.8 kg/cm; elongation: 460%; tensile strength: 23.5 kg/cm) bonded on the polyester film, a photosensitive sheet (V''') was obtained.

The obtained photosensitive sheet (V''') was exposed and developed using a negative having solid image in the same manner as that in Example 1 to obtain plate having relief (0.8 mm).

According to the examination in the same manner as that in Example 1, adhesive strength at the interface of the photosensitive layer containing the polyurethane layer and the adhesive layer on the foam layer was 2,100 g/inch.

After printing at the printing speed of 400 m/min. for 7 hours in the same manner as that in Example 1, no abnormality of separation at the interface of the polyurethane layer and the adhesive layer of the plate was observed.

EXAMPLE 4

In the same manner as that in Example 2, photosensitive structure layer (II''') was obtained. Adhesive (SK Dyne 1717) was applied onto the ethylene/vinyl acetate foam of Example 3 and dried to give an adhesive layer (30–40μ).

Polyester sheet (A) was separated from photosensitive layer (III''') which was bonded on the above adhesive layer using a rubber roller, and the polyester film for protection was separated from it to obtain a photosensitive sheet (V''''). The thus obtained photosensitive sheet (V'''') was exposed and developed using a negative having solid images in the same manner as that in Example 1 to obtain a plate having a relief (0.8 mm).

According to the examination in the same manner as that in Example 1, adhesive strength at the interface of the photosensitive layer containing the polyurethane layer and the adhesive layer on the foam layer was 1,800 g/inch.

After printing at the printing speed of 400 m/min. for 7 hours in the same manner as that in Example 1, no abnormality of separation at the interface of the polyurethane layer and the adhesive layer of the plate was observed.

COMPARATIVE EXAMPLE

In the same manner as that in Example 1, except that the polyurethane layer was not used, photosensitive sheet was obtained. According to the determination after plate making process in the same manner as that in Example 1, adhesive strength was 200 g/inch.

After printing at the speed of 400 m/min. for 40 minutes, the photosensitive layer and the adhesive layer of the plate were separated and printing could not be conducted.

What is claimed is:

1. A photosensitive resin plate for flexographic printing, comprising;
   (A) a substrate comprising a polyester film and a polyurethane or polyolefin foam layer on one side of said polyester film;
   (B) an adhesive layer on the foam layer of said substrate;
   (C) a polyurethane dried film on said adhesive layer;
   (D) a photosensitive sheet which is provided on the polyurethane layer and is chemically bonded to the polyurethane layer, comprising a polymer having rubber elasticity, an addition polymerizable unsaturated monomer and a polymerization initiator;
   (E) a slip layer on the photosensitive layer which is dissolvable in a developing solution used to develop the photosensitive layer; and
   (F) a protective layer on the slip layer.

2. The plate according to claim 1 wherein in said substrate (A), an adhesive layer is present between the polyester film and the polyurethane or polyolefin foam layer.

3. The plate according to claim 1 wherein in said substrate (A), the polyurethane or polyolefin foam layer has a skin on a surface.

4. The plate according to claim 1 wherein a silicone release layer is present between the slip layer (E) and the protective layer (F).

5. The plate according to claim 1 wherein in the photosensitive layer (D), the polymer having rubber elasticity is selected from the group consisting of a styrene-isoprene-styrene block copolymer, a styrene-butadiene-styrene block copolymer, polybutadiene, a butadiene-acrylonitrile copolymer and a urethane modified polybutadiene.

6. The plate according to claim 1 wherein the photosensitive layer (D) contains a dye dyestuff which is photo-fadeable by the activated radiation in the ultraviolet or visible region and re-colorable during development of the photosensitive layer.

7. A process for preparing the photosensitive resin plate for flexographic printing of claim 1 comprising;
   forming a polyurethane layer on a plastic layer on which a silicone releasing agent is coated,
   placing thereon a three layers structure comprising of a photosensitive layer, then a slip layer and finally a protective layer,
   exposing to light from the direction of the plastic layer,
   releasing the plastic layer, and
   adhering a substrate comprising a polyester film and a polyurethane or polyolefin foam layer on one side of the polyester through an adhesive layer.

8. The process according to claim 7 wherein a photosensitive layer comprises a polymer having rubber elasticity, addition polymerizable unsaturated monomer and a polymerization initiator in the photosensitive layer.

9. The process according to claim 8 wherein the polymer having rubber elasticity is selected form the group consisting of a styrene-isoprene-styrene block copolymer, a styrene-butadiene-styrene block copolymer, polybutadiene, a butadiene-acrylonitrile copolymer and a urethane modified polybutadiene.

10. The process according to claim 7 wherein the photosensitive layer contains a dye dyestuff which is photo fadeable by the activated radiation in ultraviolet or visible region and re-coloreable during development.

11. The process according to claim 7 wherein in said substrate, the polyurethane or polyolefin foam layer has a skin on a surface.

12. The process according to claim 7 wherein a silicone release layer is present between the slip layer and the protective layer.

* * * * *